United States Patent [19]

Tokumaru et al.

[11] 4,054,900
[45] Oct. 18, 1977

[54] I.I.L. WITH REGION CONNECTING BASE OF DOUBLE DIFFUSED INJECTOR TO SUBSTRATE/EMITTER OF SWITCHING TRANSISTOR

[75] Inventors: Yukuya Tokumaru; Masanori Nakai; Satoshi Shinozaki; Junichi Nakamura; Shintaro Ito; Yoshio Nishi, all of Yokohama, Japan

[73] Assignee: Tokyo Shibaura Electric Co., Ltd., Tokyo, Japan

[21] Appl. No.: 644,293

[22] Filed: Dec. 24, 1975

[30] Foreign Application Priority Data

Dec. 27, 1974 Japan .......................... 50-148564
Dec. 27, 1974 Japan .......................... 50-1915

[51] Int. Cl.² ............ H01L 29/72; H01L 27/04; H03K 19/08
[52] U.S. Cl. ............................ 357/46; 357/35; 357/36; 357/44; 357/50; 357/89
[58] Field of Search ............ 357/35, 36, 44, 46

[56] References Cited

U.S. PATENT DOCUMENTS

| 3,736,477 | 5/1973 | Berger et al. | 357/46 |
| 3,947,865 | 3/1976 | Russell | 357/46 |
| 3,982,266 | 9/1976 | Matzen et al. | 357/44 |

FOREIGN PATENT DOCUMENTS

| 2,224,574 | 11/1972 | Germany | 357/44 |
| 2,512,737 | 10/1975 | Germany | 357/44 |
| 1,398,862 | 6/1975 | United Kingdom | 357/44 |

Primary Examiner—William D. Larkins
Attorney, Agent, or Firm—Finnegan, Henderson, Farabow & Garrett

[57] ABSTRACT

An integrated injection logic semiconductor device which comprises an N type semiconductor substrate; a P type semiconductor layer superposed on the N type semiconductor substrate; a first N type region formed in the P type semiconductor layer; a second N type region formed in the P type semiconductor layer; and a P type region formed in the first N type region, wherein the first N type region is connected to the N type semiconductor substrate through an N type connector region formed between the first N type region and N type semiconductor substrate.

7 Claims, 16 Drawing Figures

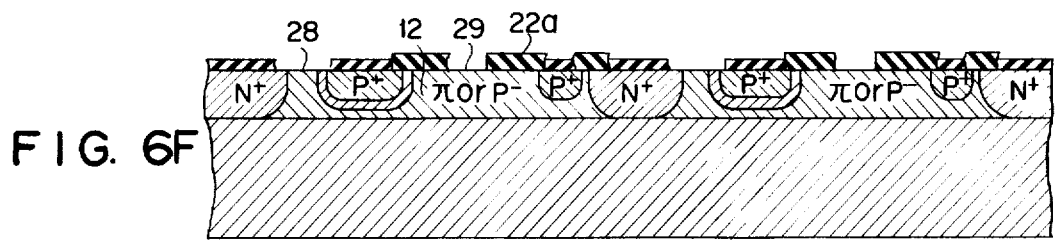
FIG. 6F
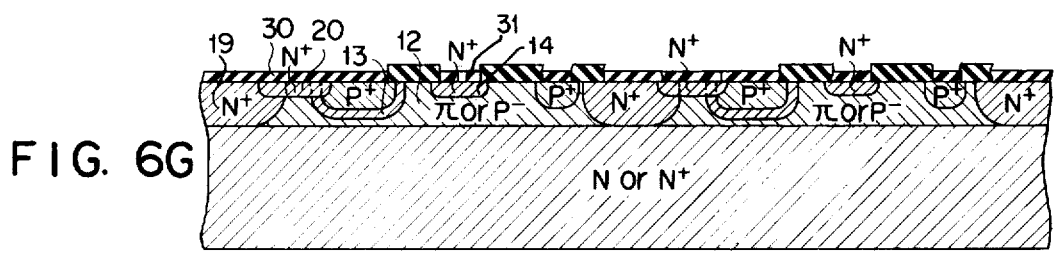
FIG. 6G
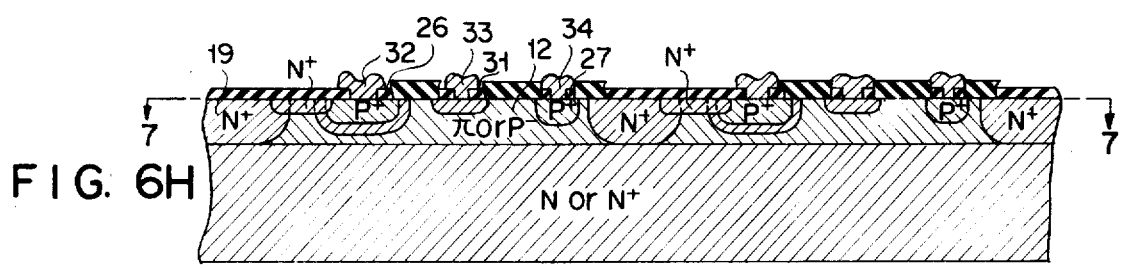
FIG. 6H
FIG. 8
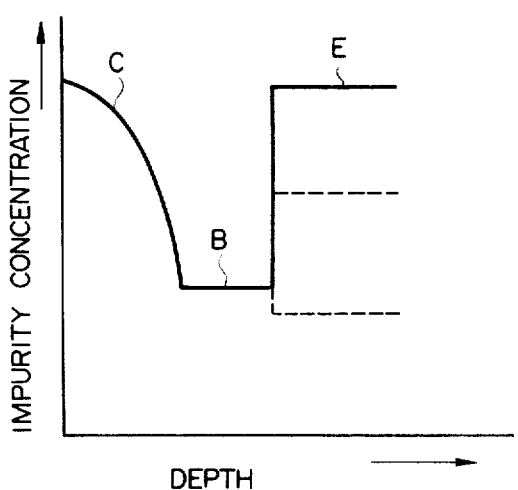

I.I.L. WITH REGION CONNECTING BASE OF DOUBLE DIFFUSED INJECTOR TO SUBSTRATE/EMITTER OF SWITCHING TRANSISTOR

BACKGROUND OF THE INVENTION

This invention relates to an integrated injection logic semiconductor device.

Recently, attention has been drawn to an integrated injection logic (abbreviated as "I²L") semiconductor device which is of a simpler construction, can be produced with a higher yield and admits of denser integration than the transistor-transisgor logic (abbreviated as "TTL") semiconductor device. This I²L (also known as "MTL") semiconductor device comprises on a semiconductor substrate a switching transistor and an injector for injecting minority carriers into the base region of the switching transistor. An input to the I²L semiconductor device is controlled with the minority carriers, thereby injecting into the base region of the switching transistor effectively controlling an output from the I²L semiconductor device, namely, the collector of a vertical transistor.

With the prior art I²L semiconductor device, an N type semiconductor layer is formed on a semiconductor substrate by epitaxial growth. Mounted on said N type semiconductor layer are first and second P type regions in which boron is selectively diffused at the rate of $10^{17}$ to $10^{19}$ atoms/cm³. Diffused in the first P region is phosphorus at the rate of $10^{19}$ to $10^{21}$ atoms/cm³ to provide an N type region. With the conventional I²L semiconductor device constructed as described above, the second P type region (emitter), N type semiconductor layer (base) and first P type region (collector) jointly constitute a lateral PNP type transistor. An N type semiconductor layer (emitter), first P type region (base) and N type region (collector) collectively form a vertical NPN type transistor. With the known I²L semiconductor device, since that portion of the N type semiconductor layer which spreads in a depth direction between the first and second P type regions is concurrently used as the base of the lateral PNP type transistor, carriers from the injector to the base region are prevented from being effectively transported, that is a sufficient carrier transport efficiency is obtained. Moreover, the base of the PNP type transistor and the emitter of the NPN transistor occupy the same region. Therefore, if the efficiency of one of these transistors is improved, that of the other transistor will fall, preventing the overall efficiency of the semiconductor device from being elevated beyond a certain extent. Since the emitter of the vertical NPN transistor is formed of an N type semiconductor layer, it is necessary to decrease the concentration of an impurity diffused in the N type semiconductor layer from that of the first P type region used as the base of said vertical NPN transistor. This also leads to the low efficiency of said transistor.

SUMMARY OF THE INVENTION

It is accordingly the object of this invention to provide an I²L semiconductor device having an elevated carrier injection efficiency and carrier transport efficiency.

According to an aspect of this invention, there is provided an I²L semiconductor device which comprises a semiconductor substrate of one conductivity type; a semiconductor layer of the opposite conductivity type superposed on the first mentioned semiconductor substrate; a first one conductivity type region mounted on the opposite conductivity type semiconductor layer and connected to the said one conductivity type semiconductor substrate; a second one conductivity type region formed on the semiconductor layer of the opposite conductivity type; an opposite conductivity type region formed in the first one conductivity type region; and a connector region of one conductivity type for connecting the first one conductivity type region to the one conductivity type semiconductor substrate. With the I²L semiconductor device constructed as described above, the opposite conductivity type region, the first one conductivity type region and the opposite conductivity type semiconductor layer constitute a lateral transistor, and the one conductivity type semiconductor substrate; the opposite conductivity type semiconductor layer and the second region of the one conductivity form a vertical transistor.

BRIEF DESCRIPTION OF THE DRAWING

FIGS. 6A to 6H present the sequential steps of manufacturing the integrated injection logic semiconductor device of the invention;

FIG. 8 sets forth an impurity concentration of the vertical transistor included in said semiconductor device.

DETAILED DESCRIPTION OF THE INVENTION

Figure 1:
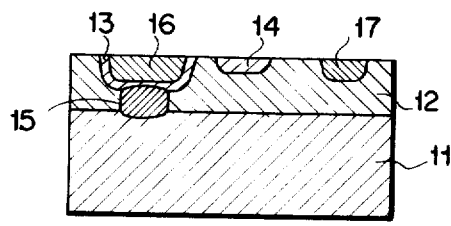
FIG. 1 is a cross-sectional view of an integrated injection logic semiconductor device according to an embodiment of this invention.
Figure 2:
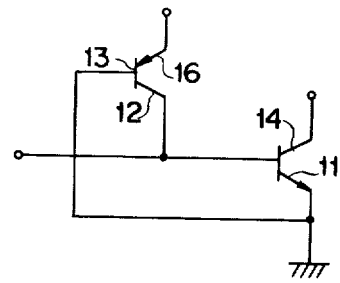
FIG. 2 is an equivalent circuit diagram of the semiconductor device of FIG. 1.

With the embodiment of FIG. 1, a semiconductor layer 12, for example, of P⁻ conductivity type containing a low impurity concentration is superposed on an N+ conductivity type semiconductor substrate 11. First and second N type regions 13, 14 are formed in the P⁻ type semiconductor layer 12 by partial diffusion to prevent the N type regions 13, 14 from reaching the N+ type semiconductor substrate. An N+ connector region 15 is formmed by the embedding process between the first N type region 13 and N+ type semiconductor substrate 11 to establish connection therebetween. First and second P+ type regions 16, 17 are diffused in the N type region 13 and P⁻ type semiconductor layer 12 respectively. An I²L circuit of FIG. 2 is formed of a lateral PNP type transistor comprising the first P+ type region 16 as an emitter, first N type region 13 as a base and P− type semiconductor layer 12 as a collector, and a vertical NPN type transistor comprising the N+ type semiconductor substrate 11 as an emitter, P− semiconductor layer 12 as a base and second N type region 14 as a collector. The first P+ region 16 acts as an injector and the second P+ region 17 is used as an ohmic contact for the P− type semiconductor layer 12.

When, in the I²L circuit element of the above-mentioned arrangement, a positive voltage of 0.8 V is impressed on the injector region 16 with the potential of the N type semiconductor substrate set at zero or earth potential, then holes injected from the injector region 16 into the base 13 of the lateral PNP transistor pass therethrough into the collector region 12 thereof. As the result, the collector region 12 receives an excess amount of holes, causing electrons to be brought into the collector region 12. The base-emitter junction of the vertical NPN transistor is forwardly biased to put the transistor into operation, thereby to bring the potential of the collector region 14 to zero potential. In this case, the base region 12 remains open or is supplied with a higher positive potential than the threshold potential of an emitter-grounded type NPN transistor. However, when the potential of the base region 12 falls to zero, the NPN vertical transistor is rendered nonconducting, causing its collector region 14 to have a positive potential. Namely, when the input section of the I²L circuit element or the second P− type region 17 of the vertical NPN transistor connected to its base region 12 is supplied with a voltage having "1" level, then the output section or collector region 14 has its voltage brought to zero. Conversely where the second P+ type region 17 is connected to zero potential, then the aforesaid output section or collector region 14 is impressed with a voltage of "1" level. Namely, the I²L circuit element acts as an inverter.

There will now be described by reference to FIGS. 3A, 3B an integrated injection logic semiconductor device according to another embodiment of this invention. The parts of FIGS. 3A, 3B the same as those of FIG. 1 are denoted by the same numerals.

Figure 3A:
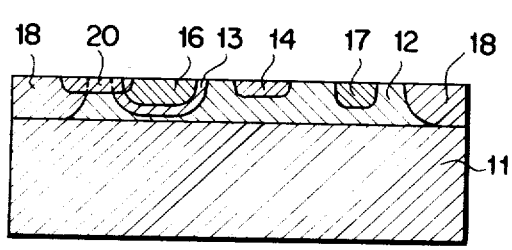
FIG. 3A is a cross-sectional view of an integrated injection logic semiconductor device according to another embodiment of the invention, wherein a connector region is provided between a separating region and a first N type region.
Figure 3B:
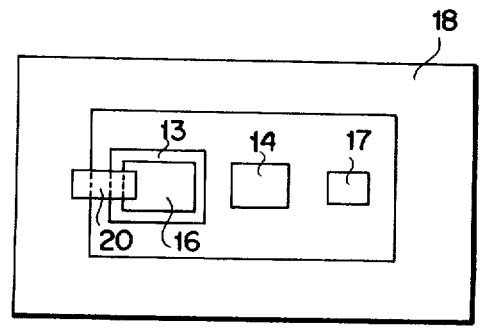
FIG. 3B is a plan view of the semiconductor device of FIG. 3A.

With the second embodiment of FIGS. 3A, 3B, an N+ type separating region 18 is provided which penetrates the P− type semiconductor layer 12 superposed on the N+ type semiconductor substrate 11 to contact said N+ type semiconductor substrate 11 and surrounds, as shown in FIG. 3B, the first N+ type region 13 (containing the first P+ type region 16) formed in the P− type semiconductor layer 12, second N type region 14 and second P+ type region 17. An N+ type connector region 20 is formed between the N+ type separating region 18 and first N type region 13 by diffusion method. This N+ type separating region 18 is intended to cause holes introduced from the injector region 16 into the collector region 12 through the first N type region 13 effectively to act on the I²L circuit element without being unnecessarily diverted into other regions.

When, as described above, the N+ type connector region 20 is formed in the surface of the P− type semiconductor layer 12, then holes injected from the base region 13 more effectively act on the I²L circuit element than in the embodiment of FIG. 1, thereby saving power consumption.

Figure 4:
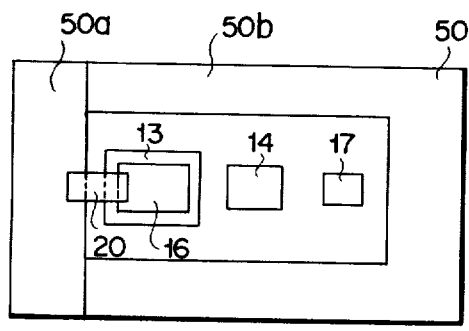
FIG. 4 is a plan view of an integrated injection logic semiconductor device according to still another embodiment of the invention, wherein the separating region of FIGS. 3A, 3B is formed of an N region and insulation region.

In the embodiment of FIGS. 3A, 3B, the separating region 18 is formed of an N type semiconductor material alone. In contrast, in the embodiment of FIG. 4, the separating region 50 is composed of an N type region 50a and insulation region 50b. The connector region 20 is so disposed as to connect the N+ type region 50a and first N type region 13. Since this arrangement reduces a capacity across the insulation region 50b and P type semiconductor layer 12 substantially to zero, the vertical transistor acting as a switching transistor carries out switching far more quickly.

Figure 5:
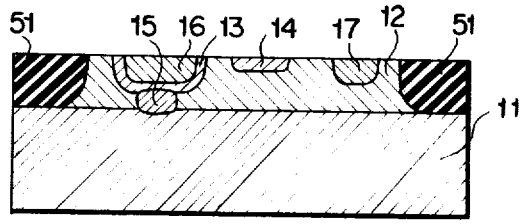
FIG. 5 is a cross-sectional view of an integrated injection logic semiconductor device according to a further embodiment of the invention, wherein the separating region is only formed of an insulation region.

In the embodiment of FIG. 5, the separating region 51 is formed of an insulator alone. The connector region 15 is provided between the first N type region 13 and N type semiconductor substrate 11. This arrangement decreases a capacity across the insulation region 51 and P type semiconductor layer 12, thereby enabling the vertical transistor acting as a switching transistor to carry out switching at a far higher speed.

There will now be described by reference to FIGS. 6A to 6H the integration process of the I²L circuit element of FIGS. 3A, 3B. In this case, a plurality of I²L elements are formed on a semiconductor substrate.

Figure 6A:
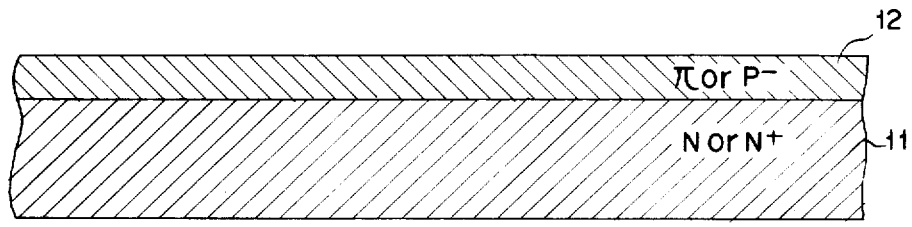
Figure 6B:
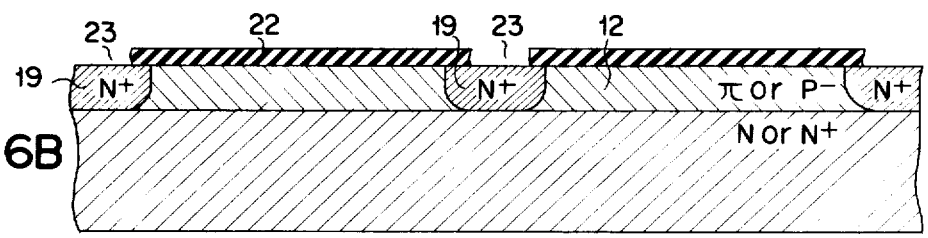

Referring to FIG. 6A, a P− or π type layer 12 is superposed on an N or N+ type semiconductor substrate 11 containing a highly concentrated impurity. This layer 12 contains a far less concentrated impurity (as $10^{14}$ to $10^{16}$ atoms/cm³) than the substrate 11. An impurity used to indicate the P type region consists of boron. The layer 12 is epitaxially grown to a thickness of, for example, 2 to 3 microns. A silicon dioxide layer or SiO₂ film 22 acting as an insulation layer is epitaxially grown on the P− or π type layer 12 generally in a high temperature oxidizing atmosphere. Thereafter, as shown in FIG. 6B, the SiO₂ film 22 is bored with a grid hole 23 by ordinary photoetching. Phosphorus used as an N type impurity is thermally diffused in the P− type layer 12 through the grid shape hole 23 to provide an N+ type region 19. In this case, diffusion is carried out at a temperature of, for example, 1100° C to cause the diffused region 19 to penetrate the P− type layer 12 up to the semiconductor substrate 11.

Figure 6C:
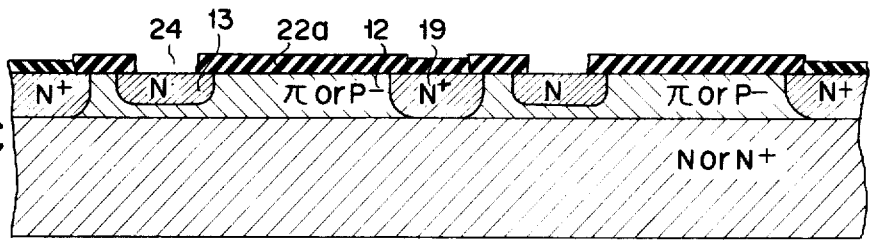

As shown in FIG. 6C, the SiO₂ film 22 is divided into a pluarlity of sections 22a by the grid shape hole 23. Each of said sections 22a is bored with an aperture 24. Phosphorus used as an N type impurity is thermally diffused in the P− type layer 12 through the aperture 24 to provide an N type region 13. The diffusion is carried out substantially at the same temperature as in the case of the N+ type region 19. The impurity of phosphorus is diffused at a concentration of $10^{17}$ to $10^{18}$ atoms/cm³.

Figure 6D:
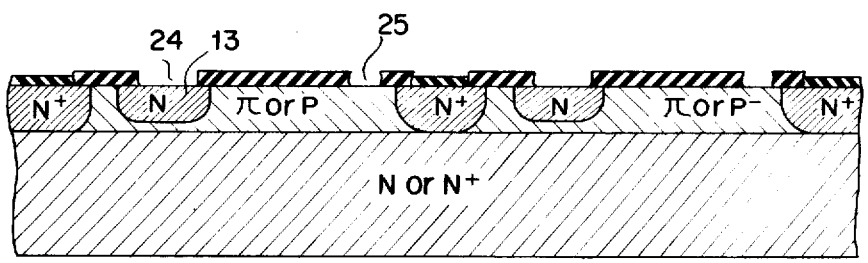

As illustrated in FIG. 6D, an aperture 25 is formed in each SiO₂ section 22a by ordinary photoetching.

Figure 6E:
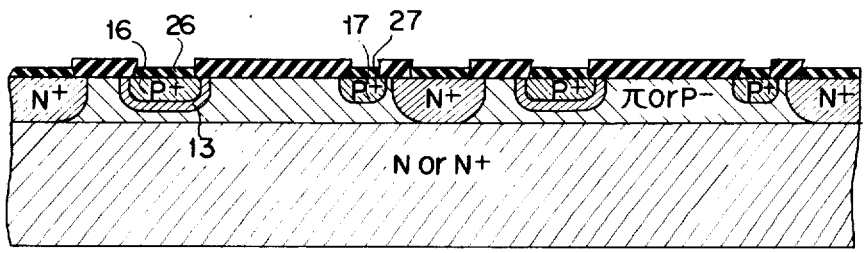

In FIG. 6E, the P+ type region 16 is formed in the N type region 13 through the aperture 24, and the P+ type region 17 is formed in the P− type layer 12 through the aperture 25. In this case, boron is used as a P type impurity and diffused in the N type region 13 and P− type layer 12 at a temperature of 1050° C in a hot oxidizing atmosphere to a depth of 1 to 2 microns. At the same time, SiO₂ films 26, 27 are deposited on the P+ type regions 16, 17. The N type region 13 and P+ type regions 16, 17 need not be formed by diffusion, but by any other process including ion implantation.

In FIG. 6F, each SiO₂ section 22a is bored with apertures 28, 29. In FIG. 6G, phosphorus used as an N type impurity is thermally diffused in the p− type layer 12 in a high temperature oxidizing atomosphere to form the N+ regions 20, 14. At this time, fresh SiO₂ films 30, 31 are deposited on the N+ type regions 20, 14 respectively. Thus, the N+ region 20 acts as a connector region to join together the N+ type region 19 and N type region 13.

Figure 7:
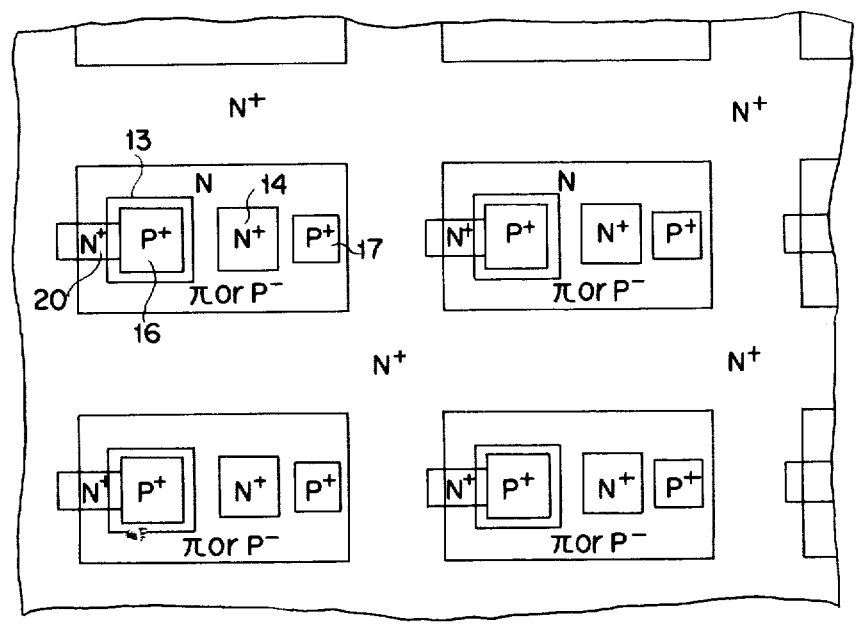
FIG. 7 is a sectional view on line 7—7 of FIG. 6H.

Referring to FIG. 6H, the SiO$_2$ films 26, 31, 27 formed on the regions 16, 14, 17 are bored with apertures respectively. An injector electrode 32, base electrode 33 and collector electrode 34 are deposited on the regions 16, 14, 17 respectively through the corresponding apertures using both evaporation and patterning of aluminium A pattern plan view of an I$^2$L semiconductor device thus formed is given in FIG. 7. An electrode specified for the N type substrate may be led out from the bottom thereof. Or the substrate electrode may be formed on the N+ type region 19 by boring an aperture in the SiO$_2$ film section 22a deposited on the N+ type layer 19. In the I$^2$L semiconductor device constructed as described above, carriers (or holes) can be injected from the whole bottom of the emitter region 16 of the PNP type lateral transistor and the peripheral part of the emitter region 16 into the base region 13 of the vertical NPN type transistor and transported through the base region 13. The injector region 16 and base region 13 are formed by a double diffusion process. The so-called self-alignment process is adopted to provide the injector region through the aperture formed in the SiO$_2$ film used in forming the base region 13. Therefore, diffusion of an impurity is so effected as to cause the base of the PNP type lateral transistor to have a uniform width. Moreover, an impurity can be diffused to a great depth to provide the injector region, and the diffusion can be precisely controlled to form the base region 13 with a very narrow width. Therefore, minority carriers can be efficiently injected from the injector into the base region 13 of the vertical NPN transistor and transported through the base region 12. As illustrated in FIG. 8 (lines C, B and E show the collector, base and emitter respectively) showing an impurity concentration in the vertical NPN transistor, this invention enables the base region 12 to be formed at a very low impurity concentration. The emitter 11 is formed at a higher impurity concentration than the base region 12, and the base region 12 is formed at a uniform impurity concentration. Therefore, carriers are more efficiently injected from the emitter 11 into the base region 12 and transported through base region 12, thereby elevating current amplification. A very low impurity concentration in the base region 12 reduces the capacity of a junction between the emitter 11 and base region 12, thereby accelerating switching. Consequently a power delay product in the I$^2$L semiconductor device is prominently diminished.

In the foregoing embodiment, the semiconductor substrate 11 was of the N type. However, it is possible to replace the type by the P type and accordingly reverse the conductivity types of the associated layer and regions. For the object of this invention, the semiconductor substrate 11 may be formed by diffusion or ion implantation. In the base region of the vertical transistor there may be formed a plurality of collector regions.

What we claim is:

1. An integrated injection logic semiconductor device which comprises a one conductivity type semiconductor substrate; an opposite type semiconductor layer superposed on said semiconductor substrate and having a lower impurity concentration that the semiconductor substrate; a first one conductivity type region formed in said opposite conductivity type semiconductor layer; an opposite conductivity type region formed in said first one conductivity type region; at least one second region of one conductivity type formed in said opposite conductivity type semiconductor layer; and a connector region of one conductivity type formed in said opposite conductivity type semiconductor layer disposed only beneath and more heavily doped than said first one conductivity type region for connection between said first one conductivity type region and said one conductivity type semiconductor substrate through a part of said first one conductivity region, wherein said opposite conductivity type region, said first one conductivity type region, and said opposite conductivity type semiconductor layer jointly constitute a lateral transistor and said one conductivity type substrate, said opposite type semiconductor layer and said second one conductivity type region collectively form a vertical transistor.

2. The semiconductor device according to claim 1, wherein an ohmic contact region is formed in said opposite conductivity type semiconductor layer with the same conductivity type.

3. An integrated injection logic semiconductor device, which comprises a one conductivity type semiconductor substrate; an opposite conductivity type semiconductor layer superposed on said semiconductor substrate and having a lower impurity concentration than the semiconductor substrate; a first one conductivity type region formed in said opposite conductivity type semiconductor layer; opposite conductivity type region formed in said first one conductivity type region; at least one second region of one conductivity type formed in said opposite conductivity type semiconductor layer; an insulation separating region surrounding said first and second one conductivity type regions penetrating said opposite conductivity type semiconductor layer to contact said one conductivity type semiconductor substrate; and a connector region of one conductivity type formed in said opposite conductivity type semiconductor layer disposed beneath and more heavily doped than said first one conductivity type region for connection between said first one conductivity type region and said one conductivity type semiconductor substrate through a part of said first one conductivity type region, wherein said opposite conductivity type region, said first one conductivity type region, and said opposite conductivity type semiconductor layer jointly constitute a lateral transistor and said one conductivity type substrate, said opposite conductivity type semiconductor layer and said second one conductivity type region collectively form a vertical transistor.

4. The semiconductor device according to claim 3, wherein an ohmic contact region is formed in said opposite conductivity type semiconductor layer.

5. An integrated injection logic semiconductor device, which comprises an N type semiconductor substrate; a P type semiconductor layer superposed on said N type semiconductor substrate and having a lower impurity concentration than the semiconductor substrate; a first N type region formed in said P type semiconductor layer; a P type region formed in said first N type region; at least one second N type region formed in said P type semiconductor layer; and an N+ type connector region formed in said P type semiconductor layer disposed beneath said first N type region for connection between said first N type region and said N type semiconductor substrate through a part of said first N type region, wherein said P type region, said first N type region, and said P type semiconductor layer jointly constitute a lateral transistor and said N type substrate, said P type semiconductor layer and said second N type region collectively form a vertical transistor.

6. The semiconductor device according to claim 5, wherein said first N type region has a higher impurity concentration than said P type semiconductor layer.

7. The semiconductor device according to claim 5, wherein an ohmic contact region of P type is formed in said P type semiconductor layer.

* * * * *